US008895969B2

United States Patent
Kim et al.

(10) Patent No.: US 8,895,969 B2
(45) Date of Patent: Nov. 25, 2014

(54) WHITE ORGANIC LIGHT EMITTING DEVICE AND DISPLAY DEVICE USING THE SAME

(71) Applicant: LG Display Co., Ltd., Seoul (KR)

(72) Inventors: Hwa-Kyung Kim, Gyeonggi-do (KR); Sung-Hoon Pieh, Seoul (KR); Jae-Il Song, Gyeonggi-do (KR); Sung-Jae Ko, Chungcheongnam-do (KR)

(73) Assignee: LG Display Co., Ltd., Seoul (KR)

( * ) Notice: Subject to any disclaimer, the term of this patent is extended or adjusted under 35 U.S.C. 154(b) by 82 days.

(21) Appl. No.: 13/672,977

(22) Filed: Nov. 9, 2012

(65) Prior Publication Data

US 2013/0119357 A1     May 16, 2013

(30) Foreign Application Priority Data

Nov. 10, 2011    (KR) .................. 10-2011-0117243
Sep. 27, 2012    (KR) .................. 10-2012-0107634

(51) Int. Cl.
*H01L 33/00*      (2010.01)
*H01L 51/00*      (2006.01)
*H01L 27/32*      (2006.01)
*H05B 33/14*      (2006.01)
*H01L 51/50*      (2006.01)
*H01L 51/52*      (2006.01)

(52) U.S. Cl.
CPC ........ *H01L 51/5048* (2013.01); *H01L 27/3209* (2013.01); *H05B 33/14* (2013.01); *H01L 51/5265* (2013.01); *H01L 2251/5376* (2013.01)
USPC .................. 257/40; 257/59; 257/72; 257/98; 257/E51.021; 257/E51.022; 257/E33.061; 257/E33.067

(58) Field of Classification Search
USPC .......... 257/40, 59, 72, 98, E51.021, E51.022, 257/E33.061, E33.067
See application file for complete search history.

(56) References Cited

U.S. PATENT DOCUMENTS

2011/0114981 A1*   5/2011   Higaki et al. ................... 257/98

* cited by examiner

*Primary Examiner* — Victor A Mandala
(74) *Attorney, Agent, or Firm* — Morgan, Lewis & Bockius LLP

(57) ABSTRACT

A white organic light emitting device, with improved color shift characteristics and improved efficiency according to viewing angle changes by controlling conditions for designing an optical path in organic material layers between a cathode and an anode or adjusting interior or exterior thicknesses of the organic material layers, has a structure including a first electrode and layers between the first electrode and a second electrode satisfies an optical path condition represented by the following equation $$\frac{n^a d^a}{\lambda} + \sum_j \frac{n_j^w d_j^w}{\lambda} = 1.85 \sim 2.15$$

with respect to emissions of the first and second stacks, where $\lambda$ is an emission peak wavelength of the first stack or the second stack, $n^a$ and $d^a$ are a refractive index and a thickness of a transparent electrode selected from the first and second electrode, and $n^w$ and $d^w$ are a refractive index and a thickness of any one of the layers disposed between the first electrode and the second electrode, respectively.

27 Claims, 15 Drawing Sheets

WHITE ORGANIC LIGHT EMITTING DEVICE AND DISPLAY DEVICE USING THE SAME

This application claims the benefit of Korean Patent Application No. P 10-2011-0117243, filed on Nov. 10, 2011 and Korean Patent Application No. P 10-2012-0107634, filed on Sep. 27, 2012, both of which are hereby incorporated by references as if fully set forth herein.

BACKGROUND OF THE INVENTION

1. Field of the Invention

The present invention relates to an organic light emitting device, and more particularly, to a white organic light emitting device with improved color shift characteristics and improved efficiency according to viewing angle changes by controlling conditions for optical path in organic material layers disposed between a cathode and an anode or adjusting interior or exterior thicknesses of the organic material layers, and a display device using the same.

2. Discussion of the Related Art

In recent years, the field of displays that visually express electric information signals has rapidly developed with the advent of the information age. Correspondingly, a variety of flat display devices having excellent performance, such as slim design, lightweight, and low power consumption, have been developed and rapidly replaced conventional cathode ray tubes (CRTs).

Detailed examples of flat panel display devices may include liquid crystal display devices (LCDs), plasma display panels (PDPs), field emission display devices (FEDs), and organic light emitting devices (OLEDs).

Among the aforementioned ones, the OLED has competitiveness because it does not need a separate light source and realizes a compact device design and vivid color.

In such OLEDs, formation of an organic light emitting layer is necessary. Conventionally, deposition using a shadow mask has been used therefor.

However, if a large-area shadow mask is used, the shadow mask sags due to heavy weight thereof so as not to be used multiple times, and defects are generated in the formation of an organic light emitting layer pattern. Thus, alternative approaches thereto are required.

As one approach replacing such a shadow mask, a tandem white organic light emitting device (hereinafter, referred to as a 'white organic light emitting device') is introduced, and the white organic light emitting device will be described.

The white organic light emitting device is manufactured by respectively depositing layers between a cathode and an anode on one another without using a mask upon formation of a light emitting diode. In other words, organic layers including organic light emitting layers are sequentially formed by depositing different materials in a vacuum state. In addition, the white organic light emitting device includes different light emitting layers emitting a plurality of colored light beams between the cathode and the anode. Since charge generation layers are respectively disposed between two adjacent light emitting layers, stacks are divided based on each light emitting layer as a basic structure.

Such a white organic light emitting device emits light by a combination of light beams emitted from a plurality of light emitting layers respectively including light emitting materials with different photoluminescence (PL) peaks at each corresponding wavelength and disposed at different positions of the device rather than using only a single material. In addition, for example, the white organic light emitting device may also be implemented by laminating a stack including a fluorescent light emitting layer and a stack including a phosphorescent light emitting layer.

However, when using known light emitting materials, as a viewing angle increases, a brightness reduction rate of the fluorescent light emitting layer is greater than that of the phosphorescent light emitting layer. Thus, as viewing angle increases, warmer white color coordinates having a lower color temperature are obtained in the white organic light emitting device. Viewers may recognize a color change according to viewing angle changes if the white organic light emitting device has such warmer white color coordinates. Thus, efforts to improve thereon have been conducted.

SUMMARY OF THE INVENTION

Accordingly, the present invention is directed to a white organic light emitting device and a display device using the same that substantially obviate one or more problems due to limitations and disadvantages of the related art.

As described above, conventional white organic light emitting devices have the following problems.

When a white organic light emitting device having a tandem structure including a fluorescent light emitting stack and a phosphorescent light emitting stack is implemented using known light emitting materials, a brightness reduction rate of a fluorescent light emitting layer is greater than a brightness reduction rate of a phosphorescent light emitting layer as a viewing angle increases, so that warmer white color coordinates having a low color temperature may be obtained. Thus, viewers recognize a color shift as the viewing angle increases.

An object of the present invention is to provide a white organic light emitting device with improved color change properties and improved efficiency even when a viewing angle changes by controlling conditions for designing optical paths of organic material layers between a cathode and an anode or regulating interior and exterior thicknesses of the organic material layers, and a display device using the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a white organic light emitting device includes a first electrode and a second electrode opposite to each other, a charge generation layer disposed between the first electrode and the second electrode, a first stack disposed between the first electrode and the charge generation layer and including a first light emitting layer emitting blue light; and a second stack disposed between the charge generation layer and the second electrode and including a second light emitting layer that includes at least one host doped with a phosphorescent dopant emitting light with a longer wavelength than blue light, wherein a structure including the first electrode and the layers disposed between the first electrode and the second electrode satisfies an optical path condition represented by the following equation $$\frac{n^a d^a}{\lambda} + \sum \frac{n^w d^w}{\lambda} = 1.85 \sim 2.15$$

with respect to emissions of the first and second stacks. Here, $\lambda$ is an emission peak wavelength of the first stack or the second stack, $n^a$ and $d^a$ are a refractive index and a thickness of a transparent electrode selected from the first and second electrode, and $n^w$ and $d^w$ are a refractive index and a thickness of any one of the layers disposed between the first electrode and the second electrode, respectively.

A total thickness of the structure may be in the range of 5000 Å to 6000 Å.

The first light emitting layer and the second light emitting layer may respectively satisfy the condition represented by the following equation $$\frac{(2m-1)\lambda}{4} = nd.$$

Here, m is an integer, n is a refractive index of each of the light emitting layers, and d is a distance between a light emitting region of each of the emitting layers and each of the transparent electrode selected from the first electrode and the second electrode and the opposite electrode.

The first stack may further include a first common layer between the first electrode and the first light emitting layer and a second common layer between the first light emitting layer and the charge generation layer. The second stack may further include a third common layer between the charge generation layer and the second light emitting layer and a fourth common layer between the second light emitting layer and the second electrode.

The first light emitting layer may have blue fluorescent emission characteristics The phosphorescent dopant of the second light emitting layer may include a yellowish green phosphorescent dopant. In this regard, four resonance conditions may be established between the first electrode and the second electrode for blue light emission and three resonance conditions may be established between the first electrode and the second electrode for yellowish green light emission.

Alternatively, the phosphorescent dopant of the second light emitting layer may include a yellow phosphorescent dopant and a green phosphorescent dopant Alternatively, the phosphorescent dopant of the second light emitting layer may include a red phosphorescent dopant and a green phosphorescent dopant.

If including at least two host, the second light emitting layer may include an electron transporting host and a hole transporting host.

Positions of the first light emitting layer and the second light emitting layer may be adjusted respectively according to emission peaks of the first and second stacks by controlling a thickness of the first common layer.

The first electrode may be directly formed on a substrate. The first common layer, the first light emitting layer, the second common layer, the charge generation layer, the third common layer, the second light emitting layer, the fourth common layer, and the second electrode may be sequentially formed on the first electrode. The first common layer may be a first hole transport layer, and the second common layer may be a first electron transport layer. The third common layer may be a second hole transport layer, and the fourth common layer may be a second electron transport layer.

The first light emitting layer may be disposed to correspond to a third blue emission-resonance condition from the substrate, and the second light emitting layer may be disposed to correspond to a third phosphorescent dopant emission-resonance condition from the substrate.

The second electrode may be directly formed on a substrate. The fourth common layer, the second light emitting layer, the third common layer, the charge generation layer, the second common layer, the first light emitting layer, the first common layer, and the first electrode may be sequentially formed on the second electrode. The first common layer may be a first electron transport layer, and the second common layer may be a first hole transport layer. The third common layer may be a second electron transport layer, and the fourth common layer may be a second hole transport layer. In this regard, positions of the first light emitting layer and the second light emitting layer may be adjusted respectively according to emission peaks of the first and second stacks by controlling a thickness of the second common layer.

The first light emitting layer may be disposed to correspond to a fourth blue emission-resonance condition from the substrate, and the second light emitting layer may be disposed to correspond to a first phosphorescent dopant emission-resonance condition from the substrate.

An optical compensation layer may be further disposed between the first electrode and the substrate. A thickness from the first common layer to the fourth common layer may be in the range of 2000 Å to 4000 Å. A thickness of the optical compensation layer may be in the range of 1000 Å to 3000 Å. The thickness of the optical compensation layer may be in a compensation relationship with a thickness of the first common layer. If a thickness from the first to fourth common layers is fixed, efficiency may increase as the thickness of the optical compensation layer increases and the thickness of the first common layer may decrease. The thickness of the optical compensation layer may be increased by a Å, and the thickness of the first common layer may be reduced by a Å.

In another aspect of the present invention, a display device includes a substrate on which a cell driving unit including a thin film transistor is formed, a first electrode connected to the thin film transistor, and a second electrode opposite to the first electrode, a charge generation layer formed between the first electrode and the second electrode, a first stack disposed between the first electrode and the charge generation layer and including a first light emitting layer emitting blue light, and a second stack disposed between the charge generation layer and the second electrode and including a second light emitting layer that includes at least one host doped with a phosphorescent dopant emitting light with a longer wavelength than blue light. Here, a total thickness of a structure including the first electrode and the layers disposed between the first electrode and the second electrode may be in the range of 5000 Å to 6000 Å, and the structure satisfies an optical path condition represented by the following equation $$\frac{n^a d^a}{\lambda} + \sum \frac{n^w d^w}{\lambda} = 1.85 \sim 2.15$$

with respect to emissions of the first and second stacks. Here, $\lambda$ is an emission peak wavelength of the first stack or the second stack, $n^a$ and $d^a$ are a refractive index and a thickness of a transparent electrode selected from the first and second electrode, and $n^w$ and $d^w$ are a refractive index and a thickness of any one of the layers disposed between the first electrode and the second electrode, respectively.

The first light emitting layer and the second light emitting layer may respectively satisfy the condition represented by the following equation, $$\frac{(2m-1)\lambda}{4} = nd.$$

Here, m is an integer, n is a refractive index of each of the light emitting layers, and d is a distance between the second electrode and a light emitting region of each of the light emitting layers.

The display device may further include a color filter layer having regions with different colors and disposed on the substrate.

In another aspect of the present invention, a display device includes a substrate on which a cell driving unit including a thin film transistor is formed, an optical compensation layer formed on the substrate provided with the cell driving unit, a first electrode connected to the thin film transistor and disposed on the optical compensation layer, and a second electrode opposite to the first electrode, a charge generation layer formed between the first electrode and the second electrode, a first stack disposed between the first electrode and the charge generation layer and including a first light emitting layer emitting blue light, and a second stack disposed between the charge generation layer and the second electrode and including a second light emitting layer that includes at least one host doped with a phosphorescent dopant emitting light with a longer wavelength than blue light. In this regard, a total thickness of the layers between the first electrode and the second electrode may be in the range of 2000 Å to 4000 Å. A thickness of the optical compensation layer may be in the range of 1000 Å to 3000 Å. The total thickness of the layers between the first electrode and the second electrode may be in a compensation relationship with the thickness of the optical compensation layer.

In this regard, if a thickness from the substrate to the external surface of the second electrode is fixed, a pure color peak brightness of light that has passed through the first and second stacks may be increased as the thickness of the optical compensation layer increases.

If a thickness from the substrate to the external surface of the second electrode is fixed, a pure color peak brightness of light that has passed through the first and second stacks may increase as the thickness of the optical compensation layer is increased by a, and the thickness of the layers between the first electrode and the second electrode is reduced by a.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a white organic light emitting device and a display device including the same according to the present invention will be described.

First, a principle of a shift of color coordinates of white light according to a viewing angle change will be described.

Figure 1A:
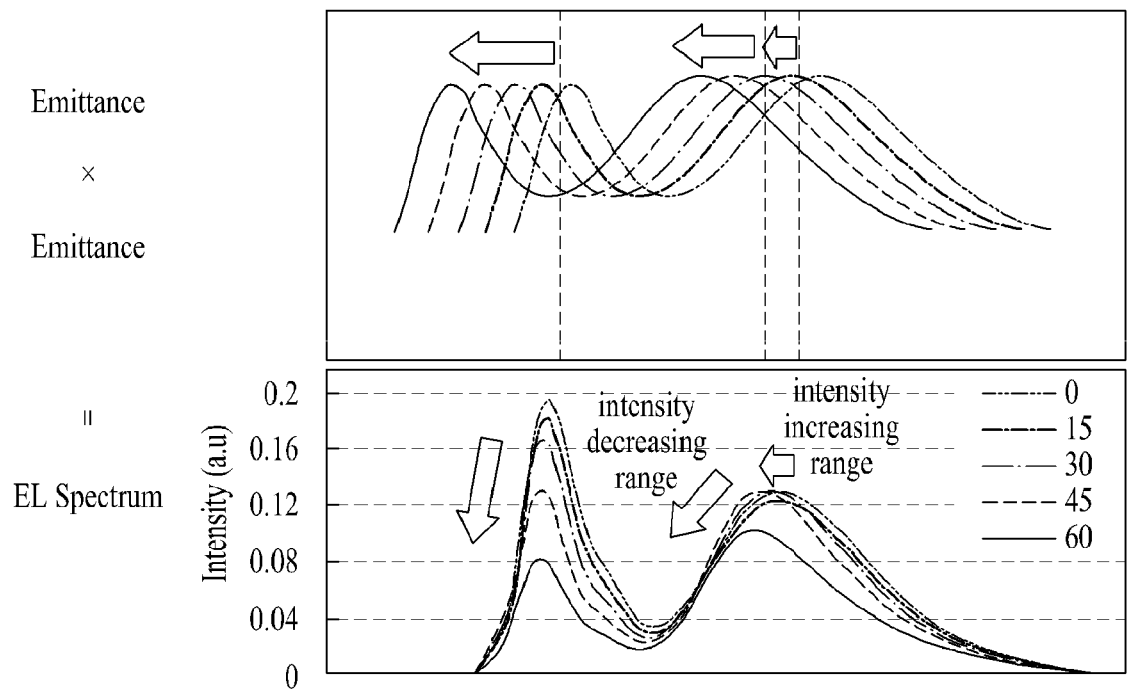
FIGS. 1A and 1B are graphs illustrating EL spectrums and intensities of a tandem white organic light emitting device having optimized efficiency of a blue light emitting stack with respect to viewing angle.
Figure 1B:
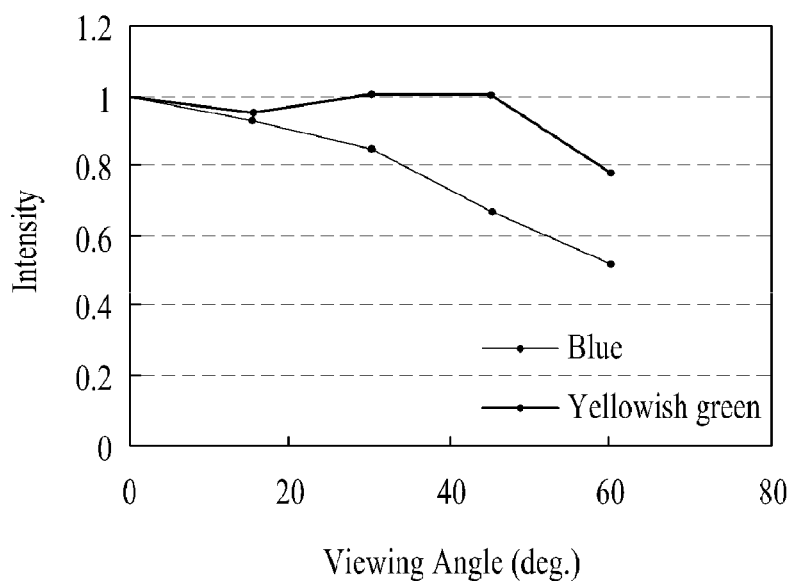

FIGS. 1A and 1B are graphs illustrating EL spectrums and intensities of a tandem white organic light emitting device having optimized efficiency of a blue light emitting stack with respect to viewing angle.

As shown in FIG. 1A, an EL spectrum is generally determined by multiplication of a photoluminescence (PL) spectrum of a light emitting material and an emittance thereof. The emittance that is determined by a refractive index and a thickness of each layer is a value indicating the degree of photons, which are generated by recombination of electrons and holes, emitted through a thin film transistor and an organic light emitting layer.

For example, when a tandem white organic light emitting device is implemented by stacking a blue fluorescent stack and a yellowish green phosphorescent stack, a fluorescent PL peak and an emittance of blue fluorescence of the blue light emitting stack are adjusted according to conditions when a viewing angle is 0° as shown in FIG. 1A in order to improve panel efficiency. In this case, the PL peak of blue fluorescence is disposed in a shorter wavelength range than that of the PL peak of yellowish green phosphorescence.

In addition, while the PL spectrum of blue light is distributed in a relatively narrow wavelength range, the PL spectrum of yellowish light with a relatively greater wavelength is distributed in a relatively wide wavelength range. Accordingly, when the viewing angle is 0°, the EL spectrum determined by multiplication of the PL spectrum and emittance is also distributed such that the peak of blue light is distributed in a narrower range, and the peak of yellowish green light is distributed in a wider range.

Meanwhile, as the viewing angle increases, emittance moves toward a shorter wavelength. Accordingly, when the viewing angle increases from 0° to 60°, brightness of the blue fluorescence decreases from the early stage of the EL spectrum. On the other hand, brightness of yellowish green phosphorescence increases at around 0° and decreases from 15°. Thus, in the tandem white organic light emitting device having the above-mentioned characteristics, characteristics of the white light realized by combination of the two colors vary according to viewing angle changes.

As shown in FIG. 1B, referring to EL intensities of the blue fluorescent stack and the yellowish green phosphorescent stack according to the viewing angle changes, blue fluorescent emission and yellowish green phosphorescent emission are reduced by similar degrees until the viewing angle increases to about 15°. However, when the viewing angle exceeds about 15°, the reduction in blue fluorescent emission is continued, but the yellowish green phosphorescent emission increases until the viewing angle reaches about 45° and decreases thereafter. That is, intensities of the blue fluorescence and the yellowish green phosphorescence are different from each other with respect to the viewing angle. As such, between colors of light emitted by one tandem white organic light emitting device have different brightness variations as the viewing angle changes, thereby causing a color shift with respect to the viewing angle.

Hereinafter, a white organic light emitting device according to the present invention in which a color shift is prevented even when the viewing angle changes by controlling the thickness and refractive index of layers disposed between a cathode and an anode such that brightness variations of colors of emitted light are similar to each other.

Figure 2:
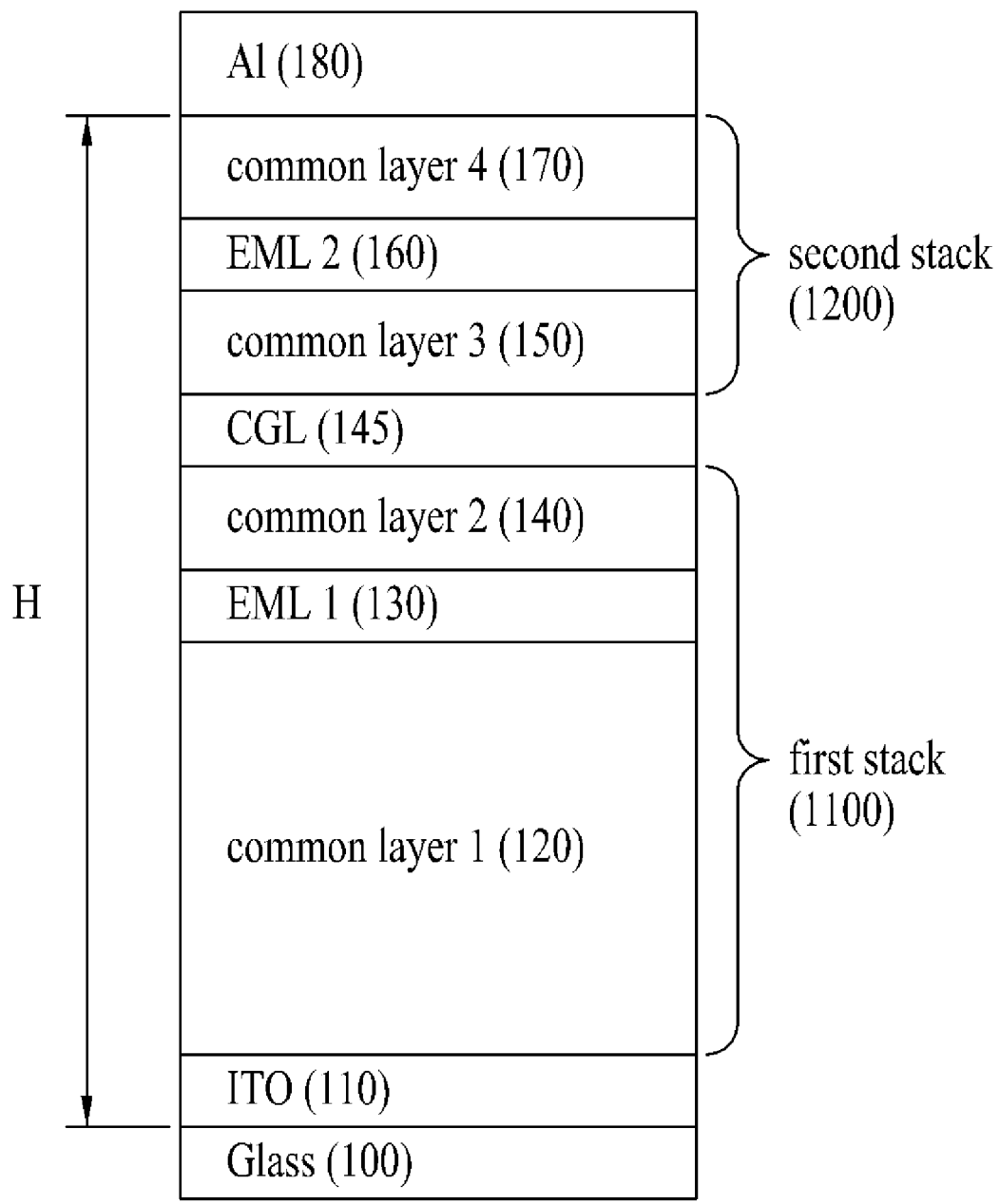
FIG. 2 is a cross-sectional view showing a white organic light emitting device according to a first embodiment of the present invention.

FIG. 2 is a cross-sectional view showing a white organic light emitting device according to a first embodiment of the present invention.

Referring to FIG. 2, the white organic light emitting device according to the first embodiment of the present invention includes a first electrode 110 and a second electrode 180 formed on a substrate 100 opposite to each other, a charge generation layer 145 disposed between the first electrode 110 and the second electrode 180, a first stack 1100 disposed between the first electrode 110 and the charge generation layer 145 and including a first light emitting layer 130 emitting blue light, and a second stack 1200 disposed between the charge generation layer 145 and the second electrode 180 and including a second light emitting layer 160 that includes at least one host doped with a phosphorescent dopant emitting light with a wavelength greater than blue light.

In addition, the first stack 1100 further includes a first common layer 120 between the first electrode 110 and the first light emitting layer 130 and a second common layer 140 between the first light emitting layer 130 and the charge generation layer 145. The second stack 1200 further includes a third common layer 150 between the charge generation layer 145 and the second light emitting layer 160 and a fourth common layer 170 between the second light emitting layer 160 and the second electrode 180.

The first common layer 120 and the third common layer 150 are hole transport layers, and the second common layer 150 and the fourth common layer 170 are electron transport layers. In addition, each of the hole transport layers and the electron transport layers may further include a hole injection layer or an electron injection layer at a side thereof close to the electrodes, respectively. In this regard, the hole transport layers and the electron transport layers may be formed by stacking functionally distinguishable layers or by mixing or codepositing functionally distinguishable materials in one layer. In addition, if required, each of the hole transport layers or electron transport layers may have a multi-layered structure for facilitating injection of holes or electrons to each of the light emitting layers.

Since the charge generation layer (CGL) 145 serves to control charge balance between the first stack 1100 and the second stack 1200 adjacent to each other, it is also referred to as an intermediate connector layer (ICL). In this case, the charge generation layer 145 may be divided into an intermediate connector metal layer for assisting injection of electrons into the first stack 1100 and an intermediate connector hole injection layer for assisting injection of holes into the second stack 1200. In this case, the electron injection layer may not be formed in the second common layer 140, and the hole injection layer may not be formed in the third common layer 150. For example, the intermediate connector metal layer is an organic material layer doped with an alkali metal material having excellent electron injection properties. The intermediate connector hole injection layer is an organic semiconductor layer including a P-type organic material.

In addition, the charge generation layer 145 may be formed as a single layer.

The white organic light emitting display device is configured to emit white light via mixing effects of blue light emitted from the first stack 1100 and phosphorescent light emitted from the second stack 1200. The color of the light emitted from the second stack 1200 is determined by the phosphorescent dopant contained in the second light emitting layer 160. For example, a yellowish green phosphorescent dopant alone, or a mixture of a yellow phosphorescent dopant and a green phosphorescent dopant or a mixture of a red phosphorescent dopant and a green phosphorescent dopant may be used. Any other phosphorescent dopant emitting a different color of light may also be used so long as it can emit white light in cooperation with blue light emitted by the first stack 1100.

In this regard, the second light emitting layer 160 includes a host as a main element in addition to the phosphorescent dopant. A single host may be used, or at least two hosts may also be used to improve hole transport properties or electron transport properties. For the phosphorescent emission, the second light emitting layer 160 is formed by doping the phosphorescent dopant by about 10% or less based on the amount of the host.

Meanwhile, the first electrode 110 is a cathode that is a transparent electrode formed of indium tin oxide (ITO), and the second electrode 180 is an anode that is a reflective metallic electrode formed of aluminum (Al), and thus the white organic light emitting device shown herein implements bottom emission.

However, the present invention is not limited thereto, and the positions of the first stack 1100 and the second stack 1200 may be reversed. In other words, a first stack emitting blue fluorescent light may be disposed on the upper portion, and a second stack emitting phosphorescent light may be disposed on the lower portion of the white organic light emitting display device. This structure will be described with reference to a second embodiment.

In addition, if required, the positions of the first electrode 110 and the second electrode 180 may be reversed to implement front emission.

Meanwhile, in order to prevent triplet excitons from being injected into the third common layer 150 or the fourth common layer 170 and to confine the excitons within the second light emitting layer 160, the third common layer 150 and the fourth common layer 170 respectively have 0.01 eV to 0.4 eV higher triplet energy-levels than a triplet energy-level of the host contained in the second light emitting layer 160.

Meanwhile, in the white organic light emitting device according to the present invention, the positions of the first light emitting layer 130 and the second light emitting layer 160 may be changed by adjusting the thickness of any of the first to fourth common layers.

For this, the white organic light emitting device according to the present invention has a total thickness H of a structure including the first electrode 110 and the layers disposed between the first electrode 110 and the second electrode 180 in the range of 5000 Å to 6000 Å. The layers corresponding to the total thickness H satisfy the following optical path conditions with respect to emissions of the first and second stacks 1100 and 1200.

<Optical Path Condition>

$$\frac{n^a d^a}{\lambda} + \sum \frac{n^w d^w}{\lambda} = 1.85 \sim 2.15$$

Here, $\lambda$ is an emission peak wavelength of the first stack 1100 or the second stack 1200, $n^a$ is a refractive index of the first electrode 110, $d^a$ is a thickness of the first electrode 110, and $n^w$ and $d^w$ are a refractive index and a thickness of each of the layers disposed between the first electrode 110 and the second electrode 180, respectively.

The optical path condition should be satisfied respectively with respect to emission peak wavelengths of the first and second stacks 1100 and 120 for finally realizing white color. For example, if the first stack 1100 emits blue light, and the second stack 1200 emits yellowish green light, on the assumption that the peak wavelengths of emission are respectively 456 nm and 564 nm, the optical path condition should be satisfied with respect to the emission peak wavelengths.

The white organic light emitting device according to the first embodiment of the present invention shown in FIG. 2 is designed to satisfy the optical path condition by increasing the thickness of the first common layer 120. In addition, in order to satisfy the above-mentioned optical path conditions, a thickness of another common layer may also be controlled. However, in the latter case, problems such as increase in driving voltage or deterioration of current properties were observed. Thus, the optical path condition was satisfied by controlling the thickness of the first common layer 120 having hole transport capabilities in an experiment according to the present invention.

In addition, distances between the first light emitting layer 130 and the second electrode 180 and between the second light emitting layer 160 and the second electrode 180 directly satisfy the following condition.

<Condition for Distance Between Light Emitting Layer and Second Electrode>

$$\frac{(2m-1)\lambda}{4} = nd$$

Here, m is an integer (positive integer), n is a refractive index of each of the light emitting layers, and d is a distance from the second electrode 180 to a light emitting region of each of the light emitting layers. This indicates that each of the light emitting layers has a maximum intensity at the corresponding distance, respectively. If designed to satisfy the distance condition, each of the light emitting layers may have a maximum intensity at a viewing angle of 0°. Even when the viewing angle increases, reductions in intensity are identical or similar to each other in the optical path toward the corresponding light emitting layer, so that the reductions in emission efficiency are identical or similar to each other.

Figure 3:
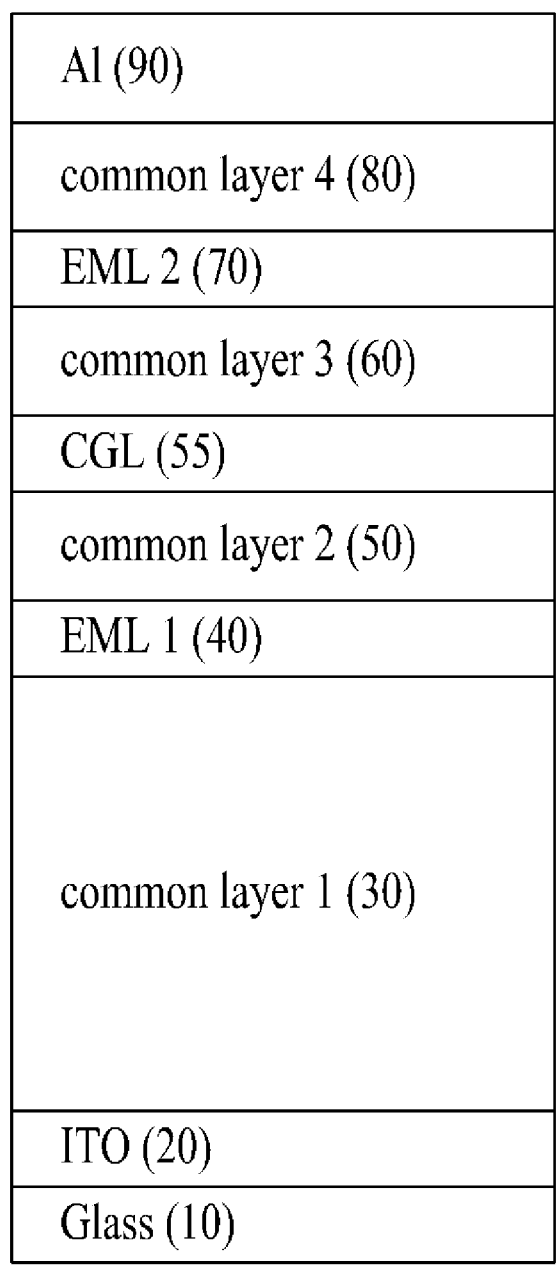
FIG. 3 is a comparative example of FIG. 2.

FIG. 3 is a comparative example of FIG. 2.

The optical path condition is not applied to the comparative example of FIG. 3, and conditions for designing the comparative example are the same as those of FIG. 2, except for the thickness of the first common layer.

In other words, the white organic light emitting device according to the comparative example shown in FIG. 3 includes a first electrode 20, a first common layer 30, a first light emitting layer 40, a second common layer 50, a charge generation layer 55, a third common layer 60, a second light emitting layer 70, a fourth common layer 80, and a second electrode 90 which are sequentially stacked on a substrate 10.

Brightness, quantum efficiency, and color coordinates of the white organic light emitting devices according to the first embodiment of the present invention and the comparative example are listed in Table 1 below.

TABLE 1

| ID | Cd/A | QE(%) | CIEx | CIEy | CCT(color temperature) |
|---|---|---|---|---|---|
| Comparative example | 75.2 | 33.7 | 0.307 | 0.346 | 6672 |
| First embodiment | 76.2 | 34.1 | 0.295 | 0.350 | 7244 |

The white organic light emitting device according to the first embodiment has improved brightness and quantum efficiency, particularly, changed color coordinates and higher color temperature compared to the comparative example. In this regard, the increase in the color temperature indicates cooler white color coordinates. Thus, it may be identified that the optical path condition set forth in the first embodiment of the present invention is significant.

Hereinafter, emittance characteristics with respect to wavelength in different thicknesses of a structure including the first electrode and the organic material layers disposed between the first electrode and the second electrode via yield contour views of the first embodiment of the present invention and the comparative example.

Figure 4A:
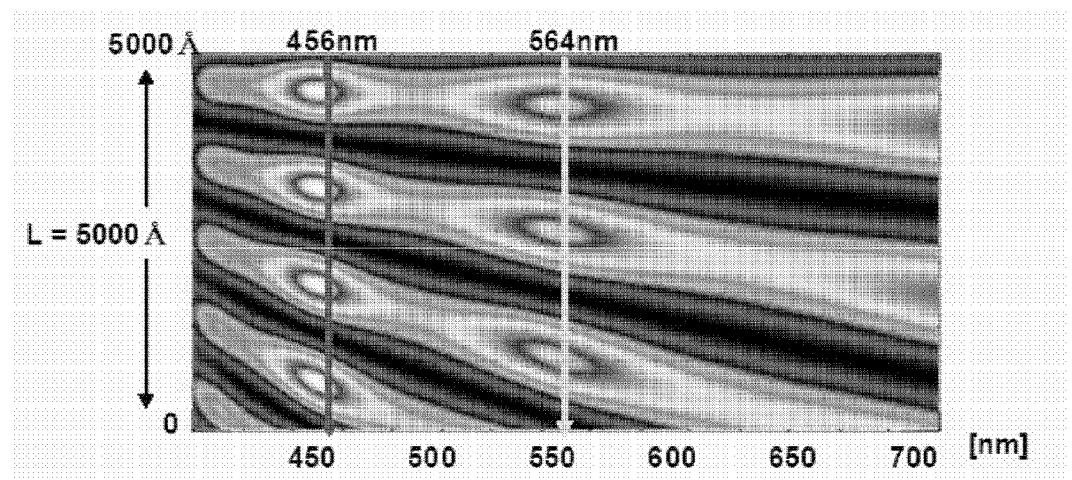
FIGS. 4A and 4B are yield contour views of the white organic light emitting devices shown in FIGS. 2 and 3 according to thickness of organic material layers.
Figure 4B:
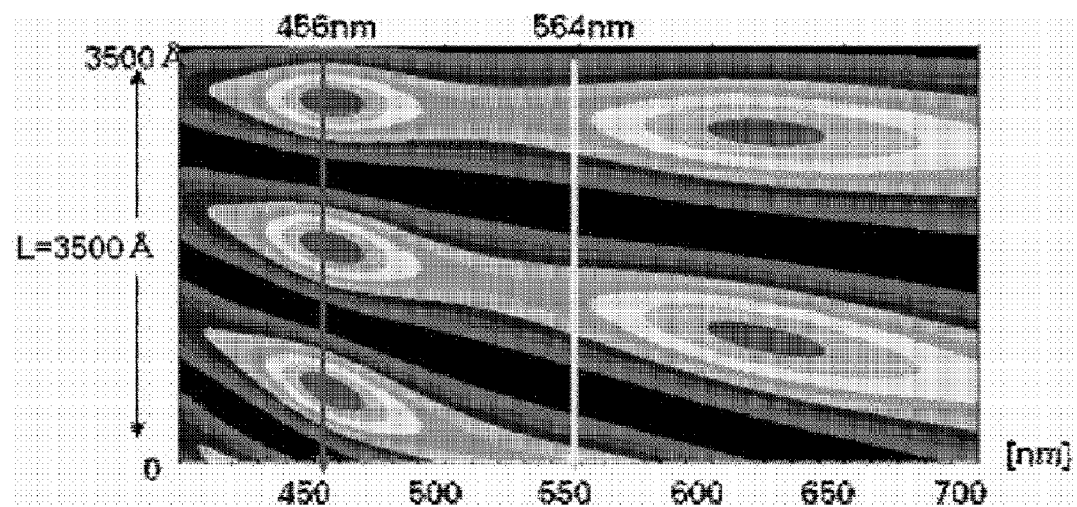

FIGS. 4A and 4B are yield contour views of the white organic light emitting devices shown in FIGS. 2 and 3 according to thickness of the structure.

The yield contour views schematically illustrate emittance with respect to wavelength in different thicknesses of the structure. Here, the horizontal axis indicates wavelength, the vertical axis indicates thickness of the structure, 0 indicates the surface of the substrate, and the end of the vertical axis indicates the bottom surface of the second electrode. In addition, the total thickness of the structure according to the first embodiment was 5000 Å, which is obtained by extending the thickness of the first common layer, and the total thickness of the structure according to the comparative example was 3500 Å.

In this regard, colors shown in the contour views indicate intensity of light at each of the wavelengths corresponding thereto. Light intensity decreases in the order of red, orange, yellow, green, blue, indigo, and violet. The red at the center of the contour line has the greatest light intensity.

As shown in FIG. 4A, according to the first embodiment of the present invention, 4 regions with maximum intensities are observed in the blue light emission at around 456 nm, and 3 regions with maximum intensities are observed in the yellowish green light emission at around 564 nm. Accordingly, a white organic light emitting device with maximum emission efficiency may be obtained by respectively designing each of the light emitting layers at one of the regions (positions) indicating the maximum intensities of the contour views. In other words, the first light emitting layer 130 emitting blue light is disposed at one of the 4 regions with maximum intensities at 456 nm, and the second light emitting layer 160 emitting yellowish green light is disposed at one of the 3 regions with maximum intensities at 564 nm. The first light emitting layer 130 and the second light emitting layer 160 are disposed at different stacks and designed under the condition that regions exhibiting maximum intensities of each light emitting layer are different.

In this regard, according to the first embodiment of the present invention, 4 resonance conditions are established between the first electrode 110 and the second electrode 180 for blue light emission and 3 resonance conditions are established between the first electrode 110 and the second electrode 180 for yellowish green light emission.

As shown in FIG. 2, if an attempt to adjust the optical path by controlling the thickness of the first common layer 120 is made, the first light emitting layer 130 is disposed to correspond to a third blue emission-resonance condition from the bottom of the graph, and the second light emitting layer 160 is disposed to correspond to a third phosphorescent dopant emission-resonance condition from the bottom of the graph. If a thickness of another layer is controlled, the positions of the light emitting layers correspond to another resonance condition. The first and second emission layers are not limited thereto.

As shown in FIG. 4B, according to the comparative example, 3 regions with maximum intensities are observed in blue light emission at around 456 nm, and 2 resonance conditions, which have intensities less than the maximum intensity, are observed in yellowish green light emission at around 564 nm. Rather, referring to the yield contour views, resonance conditions with maximum intensities are observed at a wavelength greater than 600 nm according to the comparative example.

Thus, it may be expected that an optimized emission efficiency is unattainable even when the second light emitting layer emitting yellowish green is designed to correspond to one of the two resonance conditions according to the comparative example.

Figure 5A:
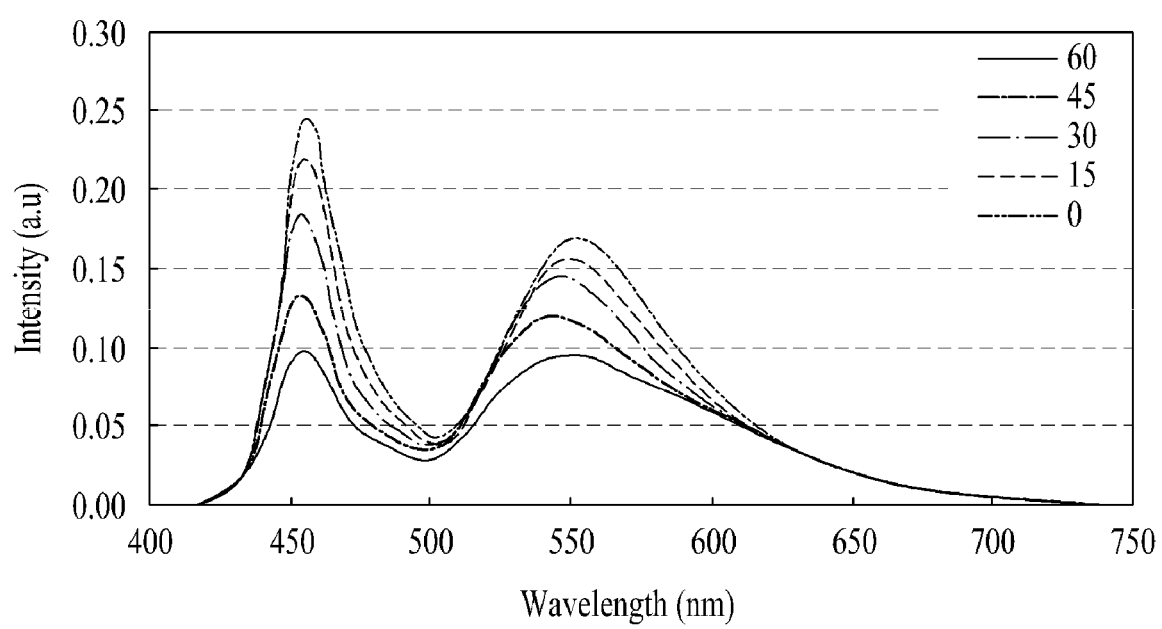
FIGS. 5A and 5B are graphs illustrating intensities of the white organic light emitting devices of FIGS. 2 and 3 with respect to wavelength when different viewing angles are applied thereto.
Figure 5B:
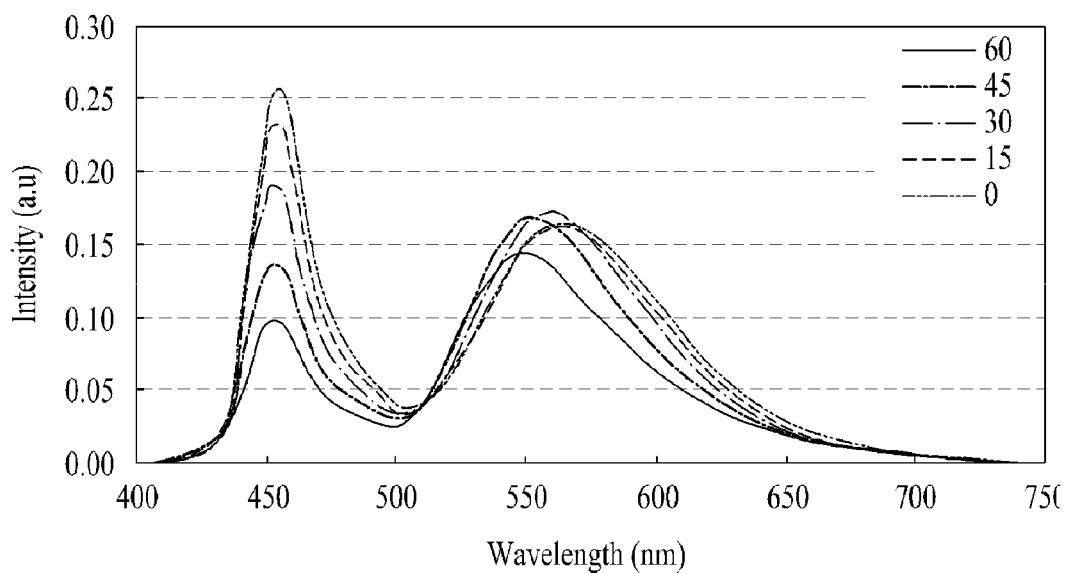

FIGS. 5A and 5B are graphs illustrating intensities of the white organic light emitting devices of FIGS. 2 and 3 with respect to wavelength when different viewing angles are applied thereto.

As shown in FIGS. 5A and 5B, light intensity variations of the white organic light emitting devices according to the first embodiment of the present invention and the comparative example with respect to the viewing angle will be described.

As shown in FIG. 5B, in the comparative example, as viewing angle increases, reduction in fluorescent efficiency is greater than that in phosphorescent efficiency, thereby increasing variations in white color coordinates. This is because an overlap area of emittance peak, which moves according to the viewing angle, and fluorescence is considerably reduced, thereby reducing emission efficiency.

As shown in FIG. 5A, according to the first embodiment, the brightness reduction rates of fluorescent light and phosphorescent light are controlled to be similar to each other by changing yield contour lines. Thus, viewers cannot recognize the changes of the white color coordinates even when the viewing angle varies since reduction in blue fluorescent efficiency is similar to that in phosphorescent efficiency. Thus, a color shift in the white color coordinates may be inhibited.

Figure 6:
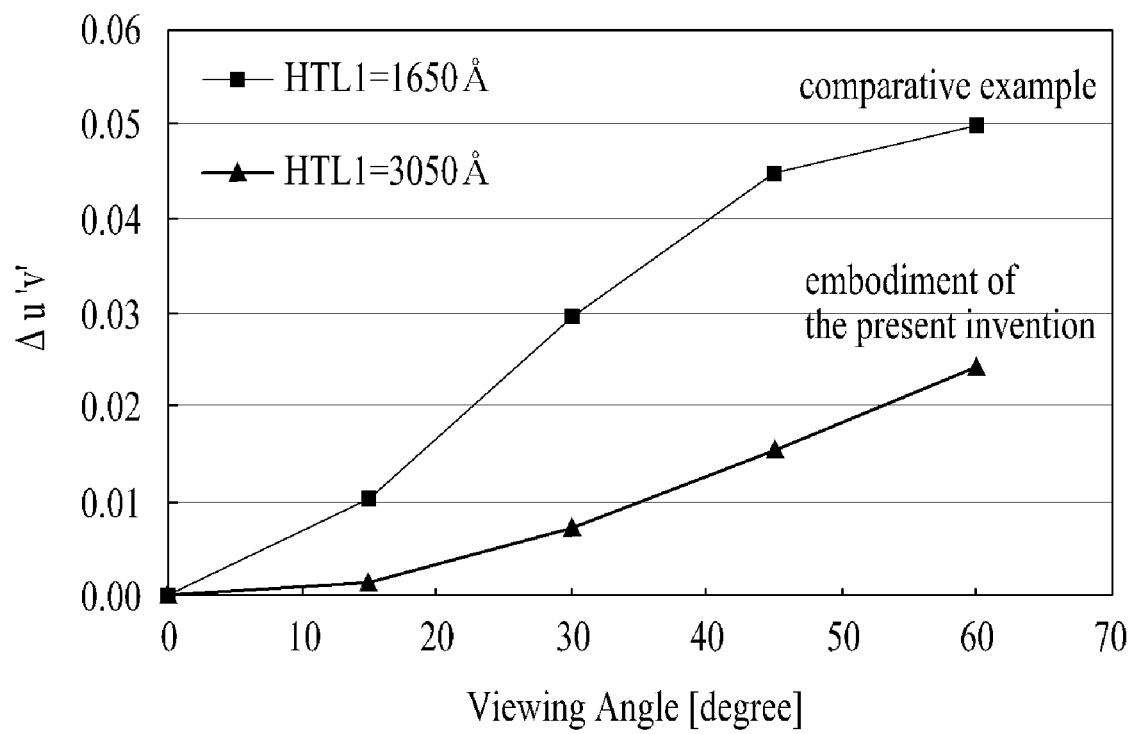
FIG. 6 is a graph illustrating color shift properties with respect to viewing angle in white organic light emitting devices of an embodiment of the present invention and a comparative example having hole transport layers with different thicknesses.

FIG. 6 is a graph illustrating color shift properties with respect to viewing angle in white organic light emitting devices of the first embodiment of the present invention and the comparative example having hole transport layers with different thicknesses.

Here, $\Delta u'v'$ shown in the vertical axis indicates color shift.

While the white organic light emitting device according to the first embodiment of the present invention has a very low color shift of 0.024, more than double this color shift was observed in the comparative example.

Particularly, in a viewing angle greater than 30°, it may be identified that the color shift according to the comparative example considerably increases. In addition, at 60°, while the color shift according to FIG. 3 is 0.049, the color shift according to FIG. 2 is 0.024 which is far less than that of FIG. 3.

Figure 7:
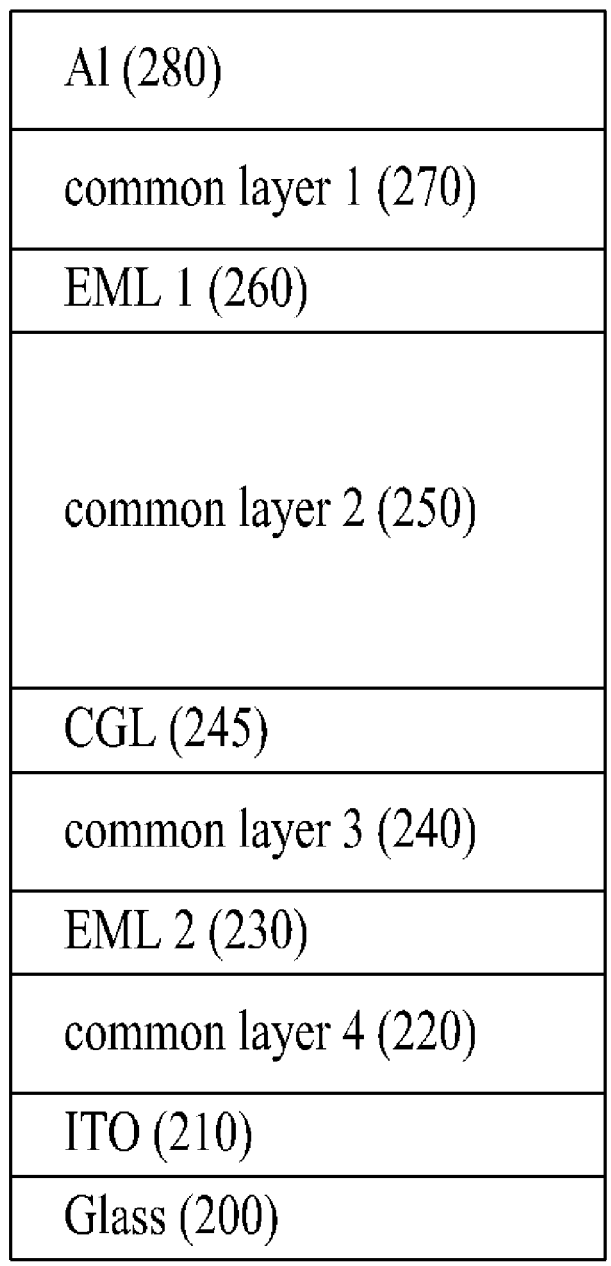
FIG. 7 is a cross-sectional view showing a white organic light emitting device according to a second embodiment of the present invention.

FIG. 7 is a cross-sectional view showing a white organic light emitting device according to a second embodiment of the present invention.

The white organic light emitting device according to the second embodiment of the present invention includes a first stack 2100 emitting blue light and disposed in the upper portion, and a second stack 2200 emitting phosphorescent light and disposed in the lower portion. The white organic light emitting device satisfies the same optical path condition as that of the first embodiment, except for the displacement of the stacks.

That is, in the stack structure of the first and second stacks 2100 and 2200, a second electrode 210 is directly formed on a substrate 200, and a fourth common layer 220, a second light emitting layer 230, a third common layer 240, a charge generation layer 245, a second common layer 250, a first light emitting layer 260, a first common layer 270, and a first electrode 280 are sequentially formed on the second electrode 210. The first common layer 270 is a first electron transport layer, the second common layer 250 is a first hole transport layer, the third common layer 240 is a second electron transport layer, and the fourth common layer 220 is a second hole transport layer.

In this case, the first light emitting layer 260 may be a blue fluorescent light emitting layer, and the second emitting layer 230 may be a phosphorescent light emitting layer emitting yellowish green or a combination of yellow and green or a combination of red and green.

Here, the first electrode 280 is a reflective electrode, and the second electrode 210 is a transparent electrode.

According to the second embodiment, the optical path condition is satisfied by controlling the thickness of the second common layer 250.

<Optical Path Condition>

$$\frac{n^a d^a}{\lambda} + \sum \frac{n^w d^w}{\lambda} = 1.85 \sim 2.15$$

Here, $\lambda$ is an emission peak wavelength of the first stack 2100 or the second stack 2200, $n^a$ is a refractive index of the second electrode 210, $d^a$ is a thickness of the second electrode 210, and $n^w$ and $d^w$ are a refractive index and a thickness of each of the layers disposed between the second electrode 210 and the first electrode 280, respectively.

In addition, distances between the first light emitting layer 260 and the first electrode 280 and between the second light emitting layer 230 and the first electrode 280 directly satisfy the following condition.

<Condition for Distance Between Light Emitting Layer and First Electrode>

$$\frac{(2m-1)\lambda}{4} = nd$$

Here, m is an integer (positive integer), n is a refractive index of each of the light emitting layers, and d is a distance from the first electrode 280 to a light emitting region of each of the light emitting layers. This indicates that each of the light emitting layers has a maximum intensity at the corresponding distance, respectively. If designed to satisfy the distance condition, each of the light emitting layers may have a maximum intensity at a viewing angle of 0°. Even when the viewing angle increases, reductions in intensity are identical or similar to each other in the optical path toward the corresponding light emitting layer, so that reductions in emission efficiency become identical or similar to each other.

In this regard, positions of the first light emitting layer 260 and the second light emitting layer 230 may be controlled according to each of the emission peaks of the first stack 2100 and the second stack 2200 by controlling the thickness of the second common layer 250.

Meanwhile, the first light emitting layer 260 is disposed to correspond to a fourth blue emission-resonance condition from the substrate 200, and the second light emitting layer 230 is disposed to correspond to a first phosphorescent emission-resonance condition from the substrate 200.

The color of the light emitted from the second stack 2200 is determined by the phosphorescent dopant contained in the second light emitting layer 230. For example, a yellowish green phosphorescent dopant alone, or a mixture of a yellow phosphorescent dopant and a green phosphorescent dopant or a mixture of a red phosphorescent dopant and a green phosphorescent dopant may be used. Any other phosphorescent dopant emitting a different color of light may also be used so long as it can emit white light in cooperation with blue light emitted by the first stack 2100.

Hereinafter, positions of the light emitting layers selected by respectively matching the devices according to embodiments of the present invention with the yield contour views with respect to thickness will be described with reference to the drawings.

Figure 8:
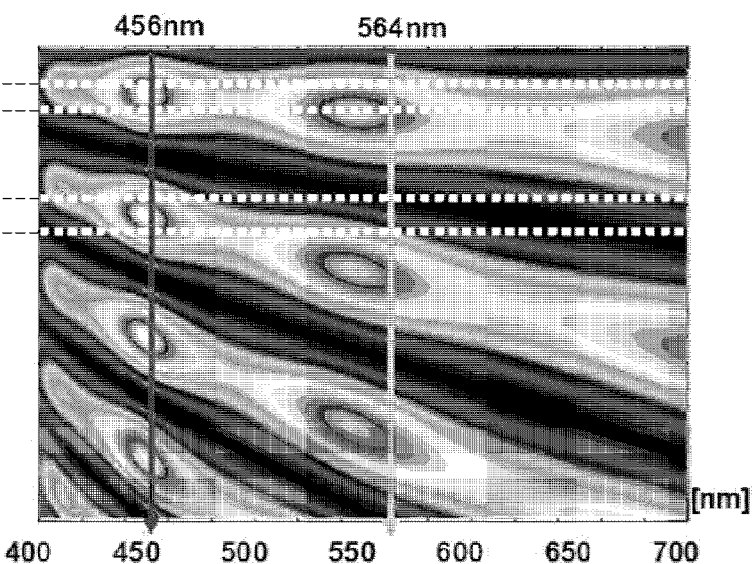
FIG. 8 shows a cross-sectional view of the white organic light emitting device according to the first embodiment and a yield contour view thereof with respect to thickness of organic material layers.

FIG. 8 shows a cross-sectional view of the white organic light emitting device according to the first embodiment and a yield contour view thereof with respect to thickness of organic material layers.

As shown in FIG. 8, in the white organic light emitting device according to the first embodiment in which the optical path condition is satisfied by controlling the thickness of the first common layer, 4 resonance conditions are established for the blue light emission, and 3 resonance conditions are established for the yellowish green light emission.

In this regard, the first light emitting layer 130 is disposed at a third blue emission-resonance condition from the substrate 100, and the second light emitting layer 160 is disposed at a third phosphorescent dopant emission-resonance condition from the substrate 100.

According to the first embodiment, regions where reductions in light intensities of the blue emission and phosphorescent emission are similar to each other even when the optical path is lengthened as the viewing angle increases are observed. Thus, efficiencies of blue emission and phosphorescent emission are reduced by similar degrees, so that a color shift of white color coordinates is not caused.

Figure 9:
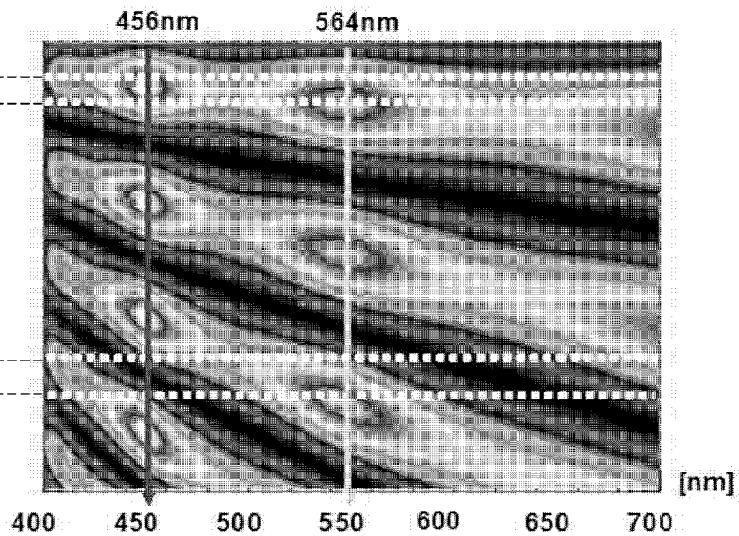
FIG. 9 shows a cross-sectional view of the white organic light emitting device according to the second embodiment and a yield contour view thereof with respect to thickness of organic material layers.

FIG. 9 shows a cross-sectional view of the white organic light emitting device according to the second embodiment and a yield contour view thereof with respect to thickness of organic material layers.

As shown in FIG. 9, in the white organic light emitting device according to the second embodiment in which the optical path condition is satisfied by controlling the thickness of the second common layer, 4 resonance conditions are established for the blue light emission, and 3 resonance conditions are established for the yellowish green light emission.

Meanwhile, the first light emitting layer 260 is disposed at a fourth blue emission-resonance condition from the substrate 200, and the second light emitting layer 230 is disposed at a first phosphorescent emission-resonance condition from the substrate 200.

According to the second embodiment as the case of the first embodiment, regions where reductions in light intensities of the blue emission and phosphorescent emission are similar to each other even when the optical path is lengthened as the viewing angle increases are observed. Thus, efficiencies of blue emission and phosphorescent emission are reduced by similar degrees, so that a color shift of white color coordinates is not caused.

Meanwhile, a display device implemented by including the white organic light emitting device will be described.

Figure 10:
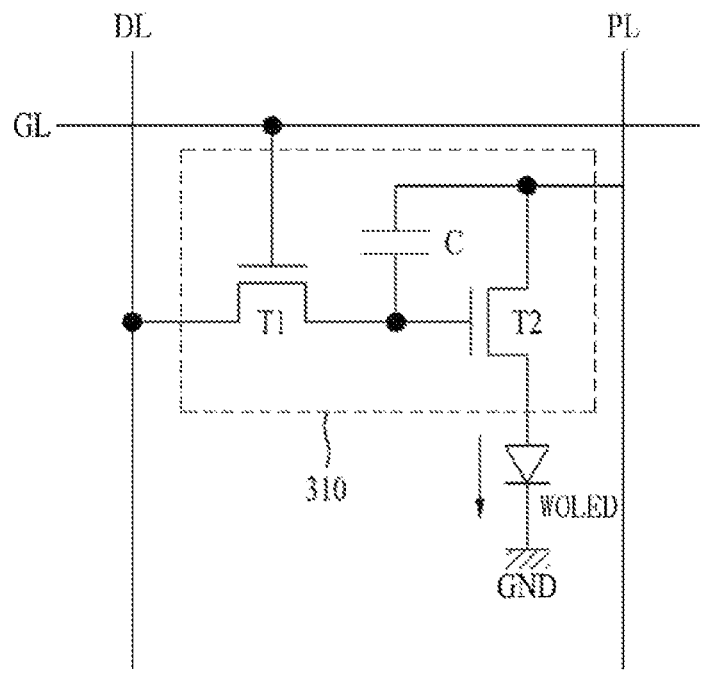
FIG. 10 is a circuit diagram illustrating a pixel of a display device including a white organic light emitting device according to the present invention.
Figure 11:
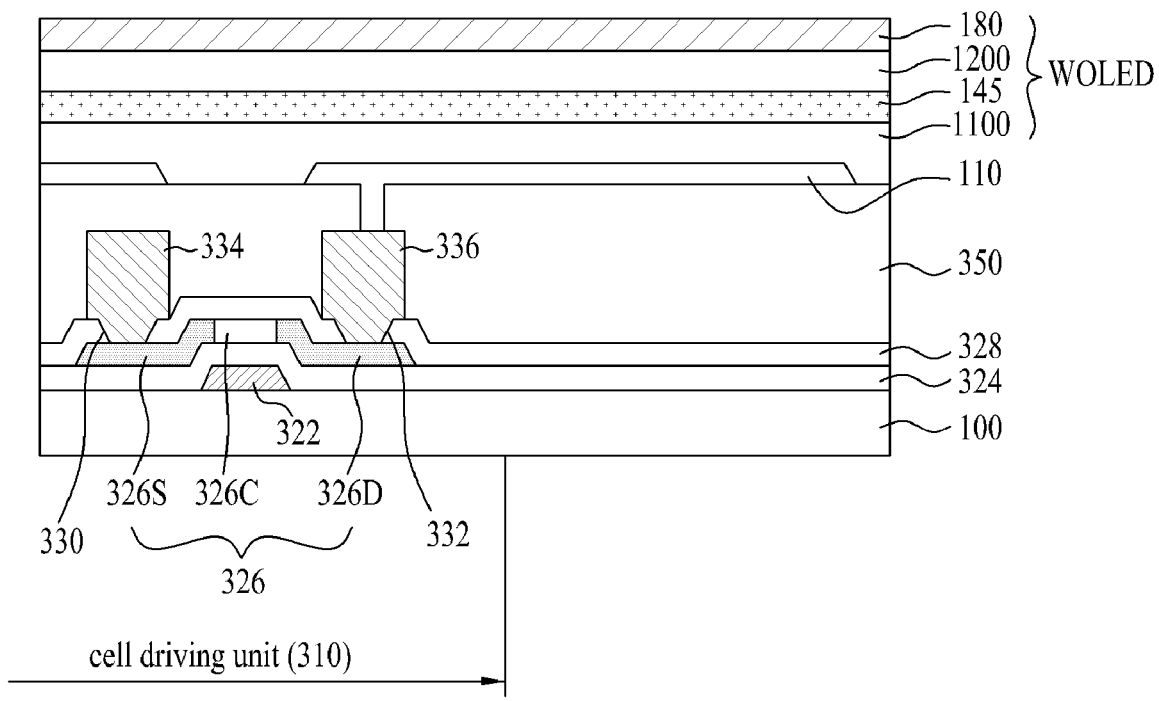
FIG. 11 is a cross-sectional view of FIG. 10.

FIG. 10 is a circuit diagram illustrating a pixel of a display device including a white organic light emitting device according to the present invention. FIG. 11 is a cross-sectional view of FIG. 10.

As shown in FIGS. 10 and 11, a pixel of a display device according to the present invention includes a cell driving unit 310 connected to a gate line GL, a data line DL, and a power line PL, and a white organic light emitting device WOLED connected between the cell driving unit 310 and the ground GND to be equivalently expressed as a diode.

The cell driving unit 310 includes a switch thin film transistor T1 connected to the gate line GL and the data line DL, a driving thin film transistor T2 connected to the switch thin film transistor T1 and between the power line PL and a first electrode of the white organic light emitting device WOLED, and a storage capacitor C connected between the power line PL and a drain electrode of the switch thin film transistor T1.

The switch thin film transistor T1 includes a gate electrode connected to the gate line GL, a source electrode connected to the data line DL, and a drain electrode connected to a gate electrode of the driving thin film transistor T2 and the storage capacitor C. The driving thin film transistor T2 includes a source electrode connected to the power line PL and a drain electrode connected to the first electrode of the white organic light emitting device WOLED. The storage capacitor C is connected between the power line PL and the gate electrode of the driving thin film transistor T2.

When a scan pulse is supplied to the gate line GL, the switch thin film transistor T1 is turned on and provides a data signal supplied to the data line DL to the storage capacitor C and the gate electrode of the driving thin film transistor T2. The driving thin film transistor T2 controls current I supplied from the power line PL to the white organic light emitting device WOLED in response to the data signal supplied to the gate electrode, thereby regulating light intensity of the white organic light emitting device WOLED. In addition, even when the switch thin film transistor T1 is turned off, the driving thin film transistor T2 supplies a constant current I by a voltage charged in the storage capacitor C until a data signal of a subsequent frame is supplied thereto, so that emission of the white organic light emitting device WOLED is maintained.

As shown in FIG. 11, the driving thin film transistor T2 includes a gate electrode 322 formed on a substrate 100, a gate insulating layer 324 covering the gate electrode 322, a semiconductor layer 326 formed on the gate insulating layer 324, an interlayer insulating layer 328 covering the semiconductor layer 326, and a source electrode 334 and a drain electrode 336 respectively connected to a source region 326S and a drain region 326D of the semiconductor layer 326 via first and second contact holes 330 and 332 passing through the interlayer insulating layer 328. The semiconductor layer 326 is formed of a LIPS thin film and includes a channel region 326C overlapping the gate electrode 322, and the source region 326C and the drain region 326D that do not overlap the gate electrode 322, have impurities, and disposed such that the channel region 326C is interposed therebetween.

Although the semiconductor layer 326 according to the current embodiment is the LIPS thin film, the present invention is not limited thereto. For example, the semiconductor layer 326 may be an oxide semiconductor layer.

The white organic light emitting device WOLED may be fabricated by forming the first electrode 110 connected to the driving thin film transistor T2 via contact holes on a color filter layer 350 covering the cell driving unit 310 including the driving thin film transistor T2, and sequentially forming the first stack 1100 including the blue light emitting layer, the charge generation layer 145, the second stack 1200 including the phosphorescent light emitting layer, and the second electrode 180 over the first electrode 110 without using a mask.

As described above, the positions of the first stack 1100 and the second stack 1200 may also be reversed as long as the light emitting layers satisfy the above-mentioned optical path condition.

Figure 12:
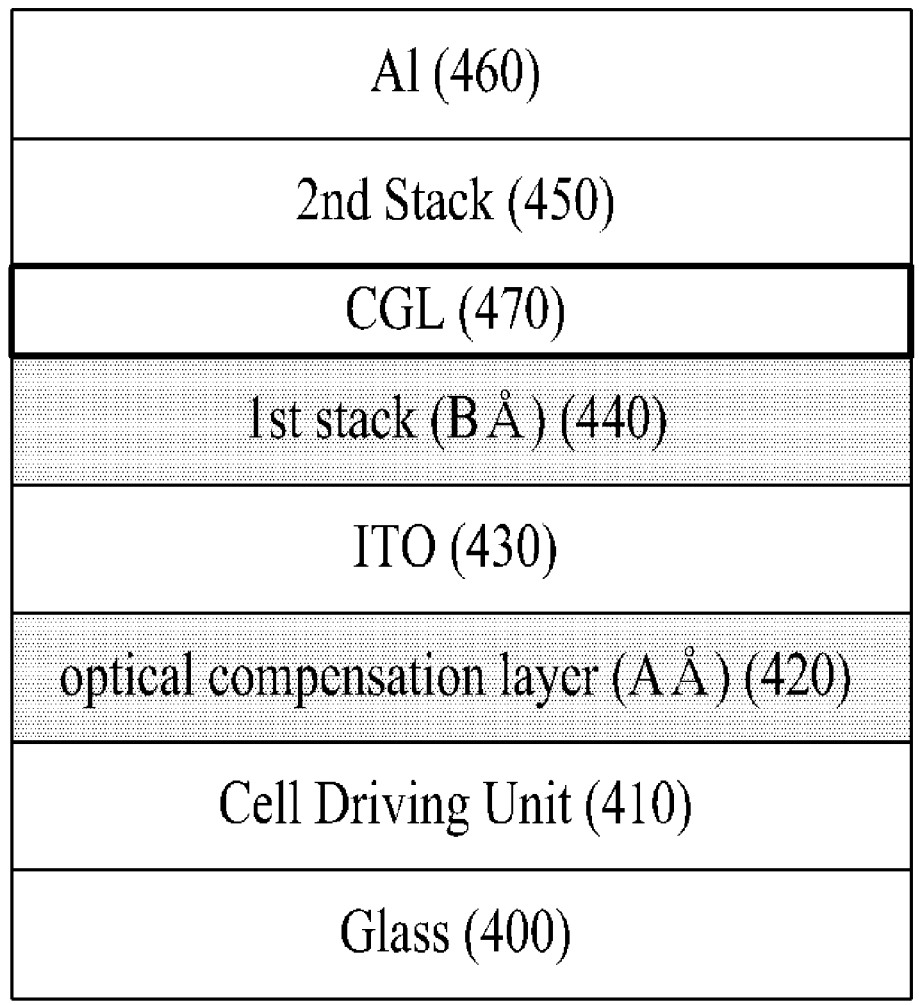
FIG. 12 is a cross-sectional view showing a display device according to a third embodiment of the present invention.
Figure 13:
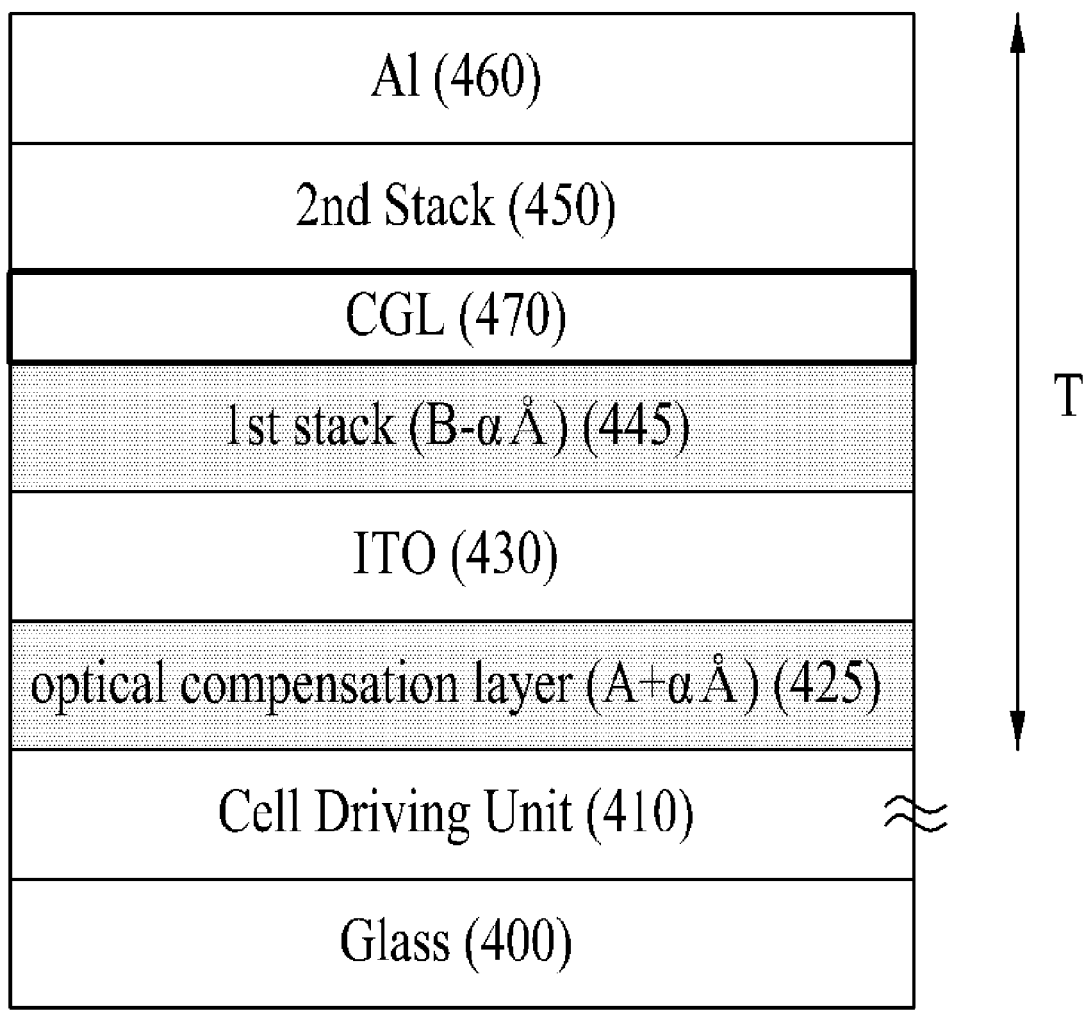
FIG. 13 is a cross-sectional view showing a modified example of FIG. 12.

FIG. 12 is a cross-sectional view showing a display device according to a third embodiment of the present invention. FIG. 13 is a cross-sectional view showing a modified example of FIG. 12.

As shown in FIG. 12, the display device according to the third embodiment of the present invention includes a cell driving unit 410 formed on a substrate 400 and including the thin film transistor described with reference to FIGS. 10 and 11, an optical compensation layer 420 formed on the cell driving unit 410, a first electrode 430 disposed on the optical compensation layer 420 to be connected to the thin film transistor of the cell driving unit 410, a second electrode 460 opposite to the first electrode 430, a charge generation layer 470 disposed between the first electrode 430 and the second electrode 460, a first stack 440 disposed between the first electrode 430 and the charge generation layer 470 and including a first light emitting layer emitting blue light, and a second stack 450 disposed between the charge generation layer 470 and the second electrode 460 and including a second light emitting layer including at least one host doped with a phosphorescent dopant emitting light with a longer wavelength than blue light.

In addition, a modified example of the third embodiment of the present invention shown in FIG. 13 has the same structure as that of FIG. 12, except that a thickness of the optical compensation layer 425 is greater than that of FIG. 12 by $\alpha$, and a thickness of the first stack 445 is less than that of FIG. 12 by $\alpha$.

In this regard, according to the modified example of the third embodiment of the present invention shown in FIG. 13, a total thickness from the first electrode 430 to the second electrode 460 is in the range of 2000 Å to 4000 Å, and a thickness of the optical compensation layer 425 is in the range of 1000 Å to 3000 Å. As such, the thicknesses of the optical compensation layer 425 and the first stack 445 are adjusted by a because the total thickness from the first electrode 430 to the second electrode 460 is in a compensation relationship with the thickness of the optical compensation layer 425.

Here, the thickness of the first stack 445 is adjusted. However, the present invention is not limited thereto, and the thickness of the second stack 450 may also be controlled.

In addition, the thickness of the stack may also be adjusted by controlling a thickness of a common layer adjacent to the light emitting layer, for example, a hole transport layer or an electron transport layer. According to the third embodiment, conditions for locating the light emitting layers are also designed in accordance with the optical path condition, resonance condition, and refractive index of the light emitting layers as described above.

Meanwhile, if a thickness from the substrate 400 to the external surface of the second electrode 460 is fixed, a pure color peak brightness of light that has passed through the first and second stacks 445 and 450 may increase as the thickness of the optical compensation layer 425 increases. This will be described with reference to graphs of experiments.

For example, if the thickness from the substrate 400 to the external surface of the second electrode 460 is fixed as T, the pure color peak brightness of light that has passed through the first and second stacks increases when the thickness of the optical compensation layer 425 is increased from A by $\alpha$ to 'A+$\alpha$', and the thickness of the organic material layers constituting the stacks between the first electrode 430 and the second electrode 460 is reduced by $\alpha$. In this example, the thickness of the first stack is adjusted to 'B−$\alpha$'.

Figure 14:
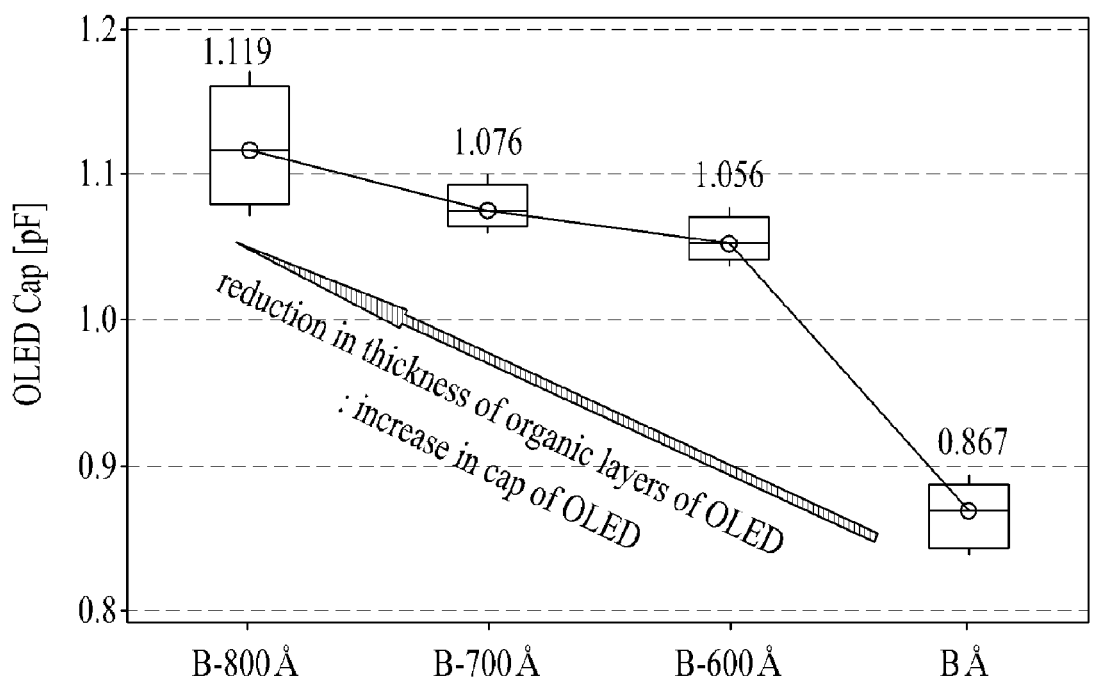
FIG. 14 is a graph illustrating capacitance changes with respect to thickness of organic material layers in a modified example of the third embodiment of the present invention.

FIG. 14 is a graph illustrating capacitance changes with respect to thickness of organic material layers in a modified example of the third embodiment of the present invention.

As shown in FIG. 14, capacitance increases as the thickness of the first stack gradually decreases from B. This may be expected in view of the general principle of capacitance that the capacitance increases as the thickness of a dielectric between electrodes decreases.

Figure 15:
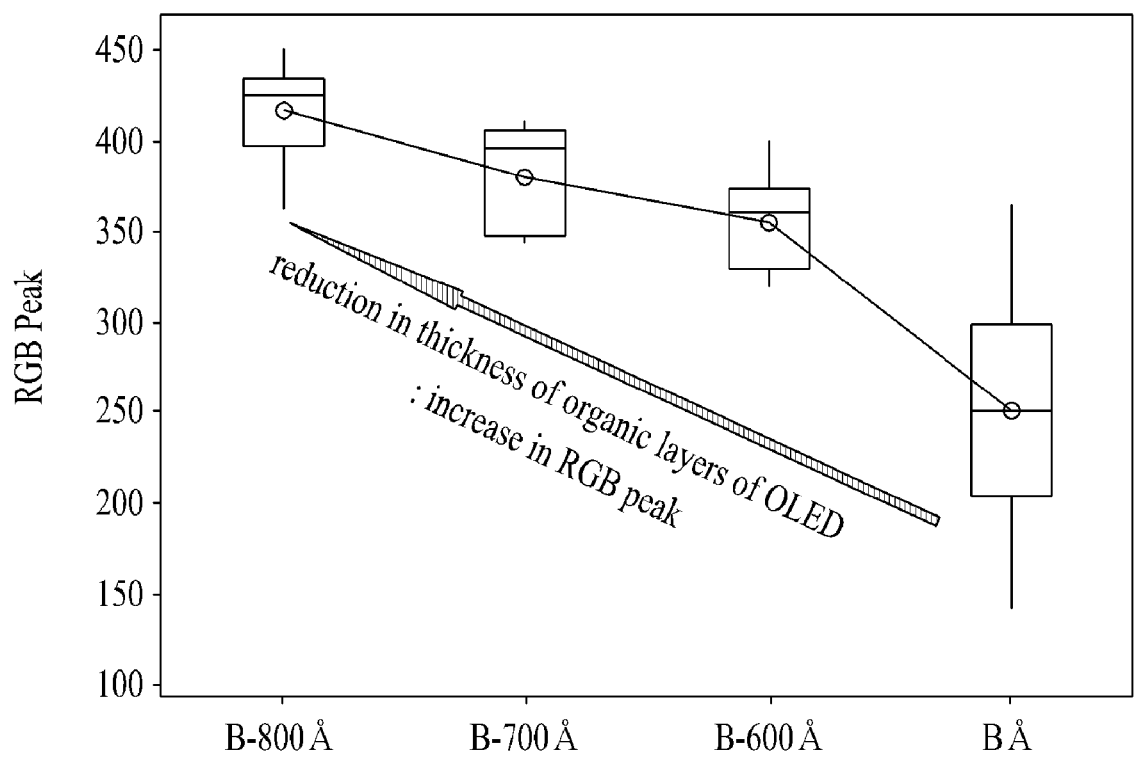
FIG. 15 is a graph illustrating RGB peak brightness variations with respect to thickness of organic material layers in a modified example of the third embodiment of the present invention.

FIG. 15 is a graph illustrating RGB peak brightness variations with respect to thickness of organic material layers in a modified example of the third embodiment of the present invention.

As shown in FIG. 15, according to the modified example of the present invention, RGB pure color peak characteristics are improved as the thickness of the organic material layers, particularly, the first stack decreases (as moving to the left side in the horizontal axis). This indicates that capacitance of the organic light emitting diode increases in the white organic light emitting device having the same IVL characteristics as the total thickness of the organic material layers (functioning as a dielectric) between the first and second electrodes since the thickness of the optical compensation layer increases by the same degree of the reduction in the thickness of the organic material layer of the first stack. Accordingly, brightness current of the organic light emitting diode increases, so that the RGB pure color peak brightness increases.

Meanwhile, in the modified example of the third embodiment of the present invention, the thickness was changed by adjusting the thicknesses of the first stack and the optical compensation layer, and the total thickness from the substrate to the second electrode was fixed. In addition, to make a factor indicating the thickness change of the first stack more significant, the thickness range of the first stack from 'B to B-600 Å' was not disclosed.

However, the thicknesses change is not limited thereto and may vary as long as the thickness of the optical compensation layer is in a compensation relationship with the thickness of the organic material layers between the first and second electrodes.

As described above, the white organic light emitting device and the display device using the same according to the present invention have the following effects.

In a tandem white organic light emitting device including a fluorescent stack and a phosphorescent stack, a color shift of white light according to viewing angle may be prevented even when the viewing angle changes by adjusting reduction rates of a fluorescent light emitting layer and a phosphorescent light emitting layer to be similar to each other by controlling thicknesses of organic material layers disposed between a cathode and an anode.

Particularly, light emitting layers are designed to have maximum emission peaks in accordance with resonance conditions for blue fluorescent emission and phosphorescent emission, respectively, by optimizing optical path conditions by controlling thicknesses of hole transport layers, which hardly influence operating characteristics of the device. Thus, even when the viewing angle increases, blue fluorescent emission and phosphorescent emission may exhibit similar degrees of light intensity reductions, so that white color coordinates according to viewing angle changes may be uniformly maintained.

Thus, a color change of white light recognized by viewers as warmer color coordinates as the viewing angle increases may be prevented.

In addition, when an optical compensation layer is disposed under a cathode and a thickness from a substrate to an anode is fixed, capacitance of an organic light emitting diode may be increased, and brightness may be increased by increasing RGB pure color peak brightness current by increasing a thickness of the optical compensation layer and reducing thickness of the organic material layers disposed between the cathode and the anode.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting device comprising:
a first electrode and a second electrode opposite to each other;
a charge generation layer disposed between the first electrode and the second electrode;
a first stack disposed between the first electrode and the charge generation layer and comprising a first light emitting layer emitting blue light; and
a second stack disposed between the charge generation layer and the second electrode and comprising a second light emitting layer that comprises at least one host doped with a phosphorescent dopant emitting light with a longer wavelength than the blue light,
wherein a structure comprising the first electrode and the layers disposed between the first electrode and the second electrode satisfies an optical path condition represented by the following equation with respect to emissions of the first and second stacks, $$\frac{n^a d^a}{\lambda} + \sum \frac{n^w d^w}{\lambda} = 1.85 \sim 2.15$$

where $\lambda$ is an emission peak wavelength of the first stack or the second stack, $n^a$ and $d^a$ are a refractive index and a thickness of a transparent electrode selected from the first and second electrode, and $n^w$ and $d^w$ are a refractive index and a thickness of any one of the layers disposed between the first electrode and the second electrode, respectively.

2. The white organic light emitting device of claim 1, wherein a total thickness of the structure is in the range of 5000 Å to 6000 Å.

3. The white organic light emitting device of claim 2, wherein the first light emitting layer and the second light emitting layer respectively satisfy the condition represented by the following equation, $$\frac{(2m-1)\lambda}{4} = nd$$

where m is an integer, n is a refractive index of each of the light emitting layers, and d is a distance between a light emitting region of each of the emitting layers and each of the transparent electrode selected from the first electrode and the second electrode and the opposite electrode.

4. The white organic light emitting device of claim 1, wherein the first stack further comprises a first common layer between the first electrode and the first light emitting layer and a second common layer between the first light emitting layer and the charge generation layer, and the second stack further comprises a third common layer between the charge generation layer and the second light emitting layer and a fourth common layer between the second light emitting layer and the second electrode.

5. The white organic light emitting device of claim 4, wherein the first light emitting layer has blue fluorescent emission characteristics.

6. The white organic light emitting device of claim 5, wherein the phosphorescent dopant of the second light emitting layer comprises a yellowish green phosphorescent dopant.

7. The white organic light emitting device of claim 6, wherein four resonance conditions are established between the first electrode and the second electrode for blue light emission and three resonance conditions are established between the first electrode and the second electrode for yellowish green light emission.

8. The white organic light emitting device of claim 5, wherein the phosphorescent dopant of the second light emitting layer comprises a yellow phosphorescent dopant and a green phosphorescent dopant.

9. The white organic light emitting device of claim 5, wherein the phosphorescent dopant of the second light emitting layer comprises a red phosphorescent dopant and a green phosphorescent dopant.

10. The white organic light emitting device of claim 5, wherein if comprising at least two host, the second light emitting layer comprises an electron transporting host and a hole transporting host.

11. The white organic light emitting device of claim 4, wherein positions of the first light emitting layer and the second light emitting layer are adjusted respectively according to emission peaks of the first and second stacks by controlling a thickness of the first common layer.

12. The white organic light emitting device of claim 4,
wherein the first electrode is directly formed on a substrate,
the first common layer, the first light emitting layer, the second common layer, the charge generation layer, the third common layer, the second light emitting layer, the fourth common layer, and the second electrode are sequentially formed on the first electrode,
the first common layer is a first hole transport layer, and the second common layer is a first electron transport layer, and
the third common layer is a second hole transport layer, and the fourth common layer is a second electron transport layer.

13. The white organic light emitting device of claim 12, wherein the first light emitting layer is disposed to correspond to a third blue emission-resonance condition from the substrate, and the second light emitting layer is disposed to correspond to a third phosphorescent dopant emission-resonance condition from the substrate.

14. The white organic light emitting device of claim 4,
wherein the second electrode is directly formed on a substrate,
the fourth common layer, the second light emitting layer, the third common layer, the charge generation layer, the second common layer, the first light emitting layer, the first common layer, and the first electrode are sequentially formed on the second electrode,
the first common layer is a first electron transport layer, and the second common layer is a first hole transport layer, and
the third common layer is a second electron transport layer, and the fourth common layer is a second hole transport layer.

15. The white organic light emitting device of claim 14, wherein positions of the first light emitting layer and the second light emitting layer are adjusted respectively according to emission peaks of the first and second stacks by controlling a thickness of the second common layer.

16. The white organic light emitting device of claim 14, wherein the first light emitting layer is disposed to correspond to a fourth blue emission-resonance condition from the substrate, and the second light emitting layer is disposed to correspond to a first phosphorescent dopant emission-resonance condition from the substrate.

17. The white organic light emitting device of claim 4, wherein an optical compensation layer is further disposed between the first electrode and the substrate.

18. The white organic light emitting device of claim 17, wherein a thickness from the first common layer to the fourth common layer is in the range of 2000 Å to 4000 Å.

19. The white organic light emitting device of claim 18, wherein a thickness of the optical compensation layer is in the range of 1000 Å to 3000 Å.

20. The white organic light emitting device of claim 17, wherein the thickness of the optical compensation layer is in a compensation relationship with a thickness of the first common layer.

21. The white organic light emitting device of claim 20, wherein if a thickness from the first to fourth common layers is fixed, efficiency increases as the thickness of the optical compensation layer increases and the thickness of the first common layer decreases.

22. The white organic light emitting device of claim 21, wherein the thickness of the optical compensation layer is increased by a Å, and the thickness of the first common layer is reduced by a Å.

23. A display device comprising:
a substrate on which a cell driving unit comprising a thin film transistor is formed;
a first electrode connected to the thin film transistor, and a second electrode opposite to the first electrode;
a charge generation layer formed between the first electrode and the second electrode;
a first stack disposed between the first electrode and the charge generation layer and comprising a first light emitting layer emitting blue light; and
a second stack disposed between the charge generation layer and the second electrode and comprising a second light emitting layer that comprises at least one host doped with a phosphorescent dopant emitting light with a longer wavelength than blue light,
wherein a total thickness of a structure comprising the first electrode and the layers disposed between the first electrode and the second electrode is in the range of 5000 Å to 6000 Å, and
the structure satisfies an optical path condition represented by the following equation with respect to emissions of the first and second stacks, $$\frac{n^a d^a}{\lambda} + \sum \frac{n^w d^w}{\lambda} = 1.85 \sim 2.15$$

where $\lambda$ is an emission peak wavelength of the first stack or the second stack, $n^a$ and $d^a$ are a refractive index and a thickness of a transparent electrode selected from the first and second electrode, and $n^w$ and $d^w$ are a refractive index and a thickness of any one of the layers disposed between the first electrode and the second electrode, respectively.

24. The display device of claim 23, wherein the first light emitting layer and the second light emitting layer respectively satisfy the condition represented by the following equation, $$\frac{(2m-1)\lambda}{4} = nd$$

where m is an integer, n is a refractive index of each of the light emitting layers, and d is a distance between the second electrode and a light emitting region of each of the light emitting layers.

25. The display device of claim 23, further comprising a color filter layer having regions with different colors and disposed on the substrate.

26. A display device comprising:
a substrate on which a cell driving unit comprising a thin film transistor is formed;
an optical compensation layer formed on the substrate provided with the cell driving unit;
a first electrode connected to the thin film transistor and disposed on the optical compensation layer, and a second electrode opposite to the first electrode;
a charge generation layer formed between the first electrode and the second electrode;
a first stack disposed between the first electrode and the charge generation layer and comprising a first light emitting layer emitting blue light; and
a second stack disposed between the charge generation layer and the second electrode and comprising a second light emitting layer that comprises at least one host doped with a phosphorescent dopant emitting light with a longer wavelength than blue light,
wherein a total thickness of the layers between the first electrode and the second electrode is in the range of 2000 Å to 4000 Å,
a thickness of the optical compensation layer is in the range of 1000 Å to 3000 Å, and
the total thickness of the layers between the first electrode and the second electrode is in a compensation relationship with the thickness of the optical compensation layer.

27. The display device of claim 26, wherein if a thickness from the substrate to the external surface of the second electrode is fixed, a pure color peak brightness of light that has passed through the first and second stacks increases as the thickness of the optical compensation layer is increased by a thickness, and the total thickness of the layers between the first electrode and the second electrode is reduced by the thickness.

* * * * *